United States Patent
Murakami et al.

(10) Patent No.: US 8,022,404 B2
(45) Date of Patent: Sep. 20, 2011

(54) LUMINESCENT DEVICE AND PROCESS OF MANUFACTURING THE SAME

(75) Inventors: Satoshi Murakami, Atsugi (JP); Mitsuhiro Ichijo, Atsugi (JP); Taketomi Asami, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 462 days.

(21) Appl. No.: 12/213,136

(22) Filed: Jun. 16, 2008

(65) Prior Publication Data
US 2008/0251792 A1 Oct. 16, 2008

Related U.S. Application Data

(62) Division of application No. 10/768,419, filed on Feb. 2, 2004, now Pat. No. 7,408,191, which is a division of application No. 10/147,924, filed on May 20, 2002, now Pat. No. 6,717,181.

(30) Foreign Application Priority Data

May 22, 2001 (JP) .................. 2001-152893

(51) Int. Cl.
*H01L 29/04* (2006.01)
(52) U.S. Cl. ........ 257/59; 257/72; 257/83; 257/E33.064
(58) Field of Classification Search .................. 257/59, 257/72, 83, E33.064
See application file for complete search history.

(56) References Cited

U.S. PATENT DOCUMENTS

| | | | |
|---|---|---|---|
| 6,175,186 B1 | 1/2001 | Matsuura et al. | |
| 6,391,482 B1 | 5/2002 | Matsuo et al. | |
| 6,498,428 B1 | 12/2002 | Matsuura et al. | |
| 6,501,098 B2 | 12/2002 | Yamazaki | |
| 6,525,467 B1 | 2/2003 | Eida et al. | |
| 6,686,322 B1 | 2/2004 | Nohara et al. | |
| 6,717,181 B2 * | 4/2004 | Murakami et al. | 257/72 |
| 6,791,129 B2 | 9/2004 | Inukai | |
| 6,852,997 B2 | 2/2005 | Yamazaki et al. | |
| 6,861,670 B1 | 3/2005 | Ohtani et al. | |
| 7,122,835 B1 | 10/2006 | Ikeda et al. | |
| 7,230,591 B2 | 6/2007 | Inukai | |
| 2005/0098894 A1 | 5/2005 | Ohtani et al. | |
| 2007/0026583 A1 | 2/2007 | Ikeda et al. | |
| 2007/0063646 A1 | 3/2007 | Yamazaki et al. | |

FOREIGN PATENT DOCUMENTS

| | | |
|---|---|---|
| EP | 0 730 298 | 9/1996 |
| EP | 0 884 930 | 12/1998 |
| EP | 1 026 222 | 8/2000 |
| EP | 1 041 622 | 10/2000 |
| EP | 1 049 141 | 11/2000 |

(Continued)

*Primary Examiner* — Minh-Loan T Tran
(74) *Attorney, Agent, or Firm* — Eric J. Robinson; Robinson Intellectual Property Law Office, P.C.

(57) ABSTRACT

In the case where a material containing an alkaline-earth metal in a cathode, is used, there is a fear of the diffusion of an impurity ion (such as alkaline-earth metal ion) from the EL element to the TFT being generated and causing the variation of characteristics of the TFT. Therefore, as the insulating film provided between TFT and EL element, a film containing a material for not only blocking the diffusion of an impurity ion such as an alkaline-earth metal ion but also aggressively absorbing an impurity ion such as an alkaline-earth metal ion is used.

16 Claims, 8 Drawing Sheets

FOREIGN PATENT DOCUMENTS

| | | |
|---|---|---|
| EP | 1 076 368 | 2/2001 |
| EP | 1 182 910 | 2/2002 |
| EP | 1 773 103 | 4/2007 |
| JP | 07-240411 | 9/1995 |
| JP | 08-298260 | 11/1996 |
| JP | 10-189252 | 7/1998 |
| JP | 2000-100569 | 4/2000 |
| JP | 2000-169766 | 6/2000 |
| JP | 2000-171985 | 6/2000 |
| JP | 2000-349301 | 12/2000 |
| JP | 2000-353811 | 12/2000 |
| JP | 2001-043973 | 2/2001 |
| JP | 2001-052878 | 2/2001 |
| WO | WO 97/31508 | 8/1997 |
| WO | WO 00-60907 | 10/2000 |

\* cited by examiner

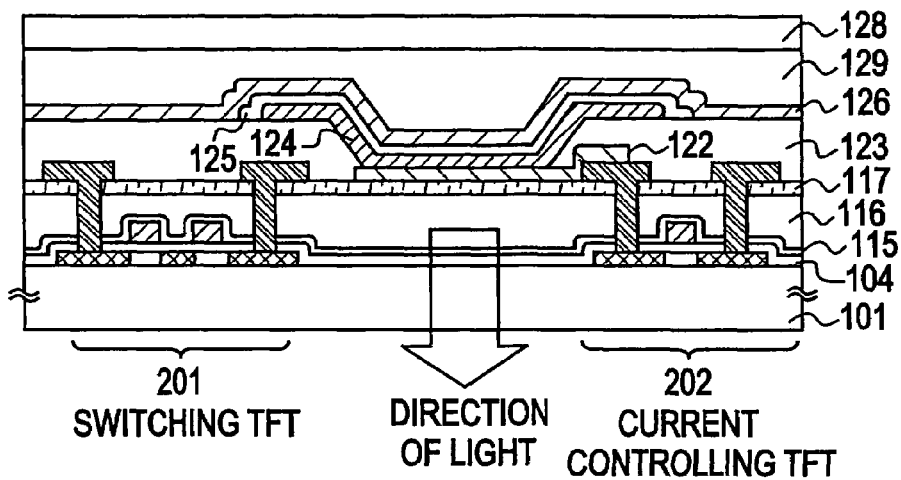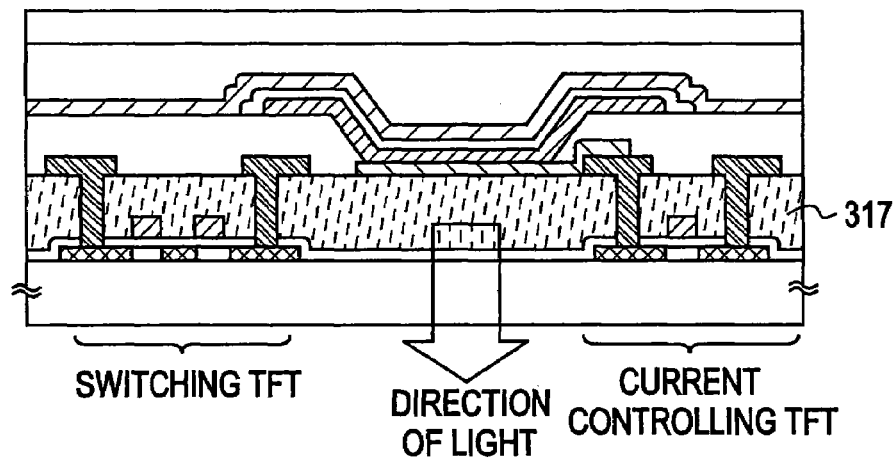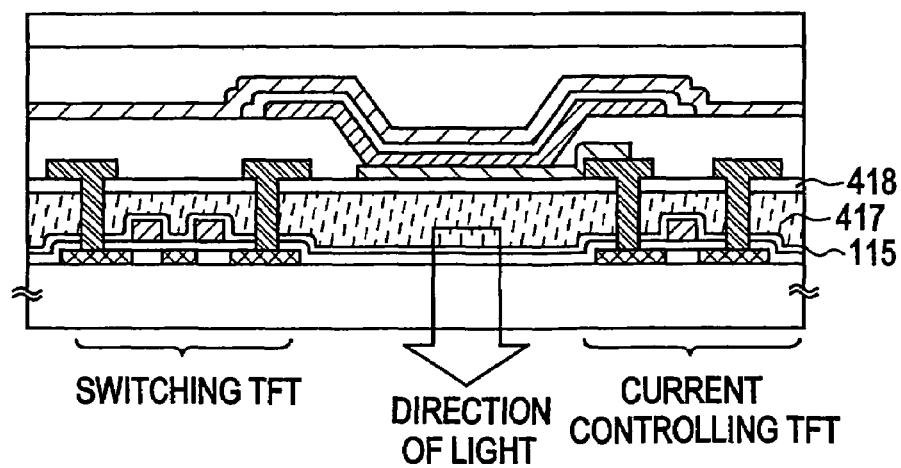

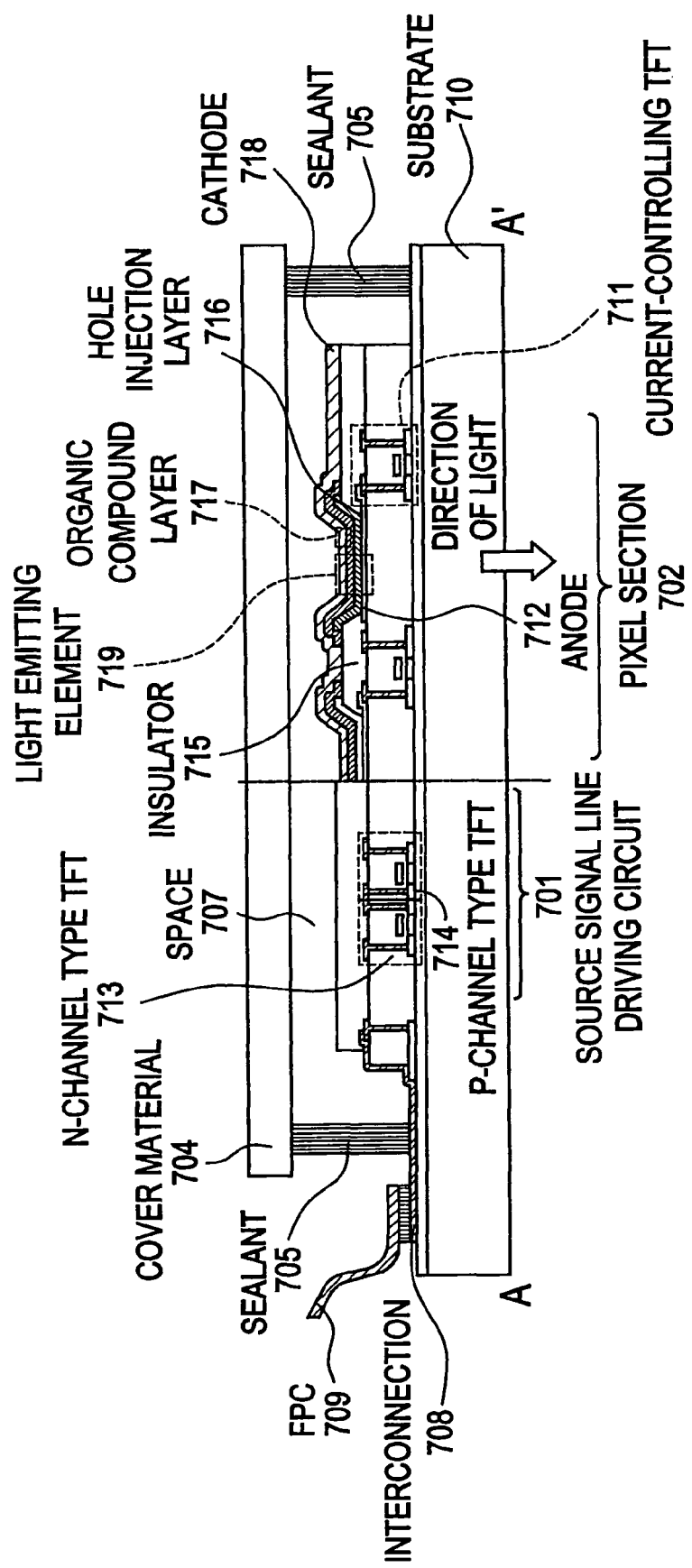

LUMINESCENT DEVICE AND PROCESS OF MANUFACTURING THE SAME

BACKGROUND OF THE INVENTION

1. Field of the Invention

The present invention relates to an electric appliance using a luminescent device which is formed by making a semiconductor element (element using a semiconductor thin film) on a substrate using a luminescent element having a film containing an organic compound with which luminescence or phosphorescence is obtained by impressing an electric field, representatively, EL (electroluminescence) display device and its EL display device as a display section.

It should be noted that in the present invention, a luminescent element is referred to an element in which an organic compound layer is provided between a pair of electrodes, a luminescent device is referred to an image display device or a luminescent device using a luminescent element. Moreover, it is defined herein that the category of luminescent devices includes all of a module in which a connector, for example, a Flexible Printed Circuit (FPC), a Tape Automated Bonding (TAB) or a Tape Carrier Package (TCP) is attached to a luminescent element, a module in which a print-wiring board is provided on the tip of the TAB or TCP, or a module in which an IC (integrated circuit) is directly mounted on a luminescent element by a Chip On Glass (COG) method.

2. Related Art

In recent years, the technology for forming a TFT on a substrate has been largely advanced, and the development applied to an active matrix type display device has been proceeded. Particularly, since electric field effect mobility of a TFT using a polysilicon film is higher than that of the conventional TFT using an amorphous silicon film (which is also referred to as "mobility"), an operation at a high speed is capable of being carried out.

Such an active matrix type display device now attracts a great deal of attention since it obtains a variety of advantages such as the reduction of the manufacturing costs, the miniaturization of a display device, the raising of yield, the reduction (increase?) of throughput and the like by utilizing a method in which a variety of circuits and elements are made up on the same substrate. A luminescent element using an organic compound having the characteristics such as being thin type, light weighted, having a high speed responsibility, direct current low voltage drive and the like as an emitter is expected to be applied to the next generation flat panel display. Particularly, a display device in which luminescent elements (which is also referred to as EL element) are arranged in a matrix shape (hereinafter, referred to as "active matrix type EL display device") is considered to be advantageous when comparing to the conventional liquid crystal display devices from the viewpoint that it has a wide angular field of view and is excellent in visibility.

An active matrix type EL display device provides a switching element consisted of a TFT (hereinafter, referred to simply as switching element) at each pixel, makes a drive element for performing a current control by its TFT for switching (hereinafter, referred to as TFT for current control) operate and makes an EL layer (strictly referring to it, it is an emitting layer) emit. For example, an EL display device described in Japanese Unexamined Patent Publication No. H10-189252 gazette is known.

As for an active matrix type EL display device, two kinds of structures are considered from the viewpoint of emission direction of the light. One is a structure in which the light emitted from the EL element transmits through the opposed substrate and is irradiated into the observer's eyes. In this case, the observer can recognize the image from the opposed substrate side. Another one is a structure in which the light emitted from the EL element transmits through an element substrate and is irradiated into the observer's eyes. In this case, the observer can recognize the image from the element substrate side.

In the case where an active matrix type EL display device was intended to prepare, after a thin film transistor (hereinafter, referred to as TFT) was formed on the insulating surface, an interlayer insulating film is formed on the TFT, an anode of a luminescent element electrically connected to the TFT via the interlayer insulating film is formed, and further on the anode, an organic compound layer is formed, and further, after the organic compound layer was formed, a cathode is formed whereby a luminescent element is formed.

As a material used for a cathode, it is said that it is preferable to use a metal having a small work function (representatively, metal elements belonging to I group or II group of the periodic table) or an alloy containing these. Since the smaller the work function is, the more the luminous efficiency is enhanced, it is preferable that among these, as a material used for a cathode, an alloy containing Li (lithium), which is one of alkaline metals, is used.

However, in the case where a material containing an alkaline metal is used for a cathode, while it can contributes to the enhancement of the luminous efficiency of the luminescent element, there is a fear of the alkaline metal ion used for the cathode being diffused to be mixed into an active layer of the TFT.

In a TFT, when the voltage is applied to a gate electrode, depending on its polarity, an impurity ion of an alkaline metal or the like is attracted to an active layer side. Then, in the case where these impurity ions cannot be blocked by an insulating film for covering the active layer, these are mixed into the interface between the insulating film and the active layer and into the active layer, causes the increase of interface level and becomes trapping center of a carrier, it is considered to cause the variation of electric characteristics of the TFT and the lowering of the reliability for the TFT.

At present, as an insulating film for covering an active layer of TFT, an inorganic insulating film represented by a silicon oxide film, a silicon nitride film, a silicon oxynitride film and the like and an organic resin film represented by a polyimide film, an acrylic film and the like are used. The experiment for confirming the blocking effects of these insulating films were carried out.

As a result of examining the characteristic variation of the MOS by preparing a MOS on a substrate having an insulating surface and forming an Al—Li alloy via an insulating film (silicon nitride film, silicon oxynitride film) located above the MOS, the characteristic variation was large, and it is considered that the cause of it is mainly attributed to the fact that Li has been mixed into the active layer.

Therefore, it is considered that the variation of TFT characteristics and the lowering of the reliability are also occurred in the case where an EL element having a cathode containing an alkaline metal on TFT was formed.

From the results described above, an insulating film provided between a TFT and an EL element was not sufficient for preventing an impurity ion (representatively, alkaline metal ion) from diffusing from the EL element into the TFT.

Moreover, also in the case where a material containing an alkaline metal in an organic compound layer was used, it is considered that the diffusion of an impurity ion (representatively, alkaline metal ion) from the EL element into the TFT is generated.

Moreover, although there are some cases where what is called a buffer layer is formed between a cathode and an anode, but also in the case where a material containing an alkaline metal in this buffer layer was used, it is considered that the diffusion of the impurity ion (representatively, alkaline metal ion) from the EL element to the TFT is generated.

Moreover, also in the case where a material containing an alkaline-earth metal (which is also referred to as alkaline earth) in a cathode, an anode, a buffer layer, or an organic compound layer was used, similarly, there is a fear of the diffusion of an impurity ion (representatively, alkaline-earth metal ion) from the EL element to the TFT being generated and causing the variation of characteristics of the TFT.

BRIEF SUMMARY OF THE INVENTION

As for the present invention, the present inventors have directed their attention to the above-described problems, and clarified that as an insulating film provided between a TFT and an EL element, it is preferable that a material for not only blocking the diffusion of an impurity ion such as an alkaline metal ion, an alkaline-earth metal ion or the like, but also absorbing an impurity ion such as an alkaline metal ion, an alkaline-earth metal ion or the like is used, and further a material endurable to the temperature for the processing, which is performed later, is suitable for its use.

As a material for matching these conditions, a silicon nitride film containing a large amount of fluorine is listed as an example. The fluorine concentration contained in the film of the silicon nitride film may be $1 \times 10^{19}/cm^3$ or more, preferably, the composition ratio of the fluorine in the silicon nitride film may be set in the range from 1 to 5%. Fluorine in the silicon nitride film is bonded to an alkaline metal ion, an alkaline-earth metal ion or the like, and absorbed in the film. Moreover, a silicon oxynitride film containing a large amount of fluorine is listed as another example. Moreover, an organic resin film containing a particle consisted of an antimony (Sb) compound, a tin (Sn) compound, or an indium (In) compound for absorbing an alkaline metal ion, an alkaline-earth metal ion or the like, for example, an organic resin film containing antimony pentaoxide particle ($Sb_2O_5 \cdot nH_2O$) is also listed as the other example. It should be noted that this organic resin film contains a particle having an average diameter of 10-20 nm, and its optical transparency is also very high. An antimony compound represented by this antimony pentaoxide particle tends to easily absorb an impurity ion such as an alkaline metal ion or the like, and an alkaline-earth metal ion.

It should be noted that needless to say, it might be a configuration in which an insulating film consisted of a material for absorbing the above-described impurity ion is provided on one portion or the whole surface.

Moreover, in the case where a silicon nitride film containing fluorine at the composition ratio in the range from 1 to 5% is used as an insulating film for absorbing an impurity ion such as an alkaline metal ion, an alkaline-earth metal ion or the like, it is capable of being made so that degas from the organic resin film does not exert a bad influence on a luminescent element.

Moreover, as for the present invention, preferably it is configured so that an anode containing an alkaline metal ion and an alkaline-earth metal ion or an organic compound layer containing an alkaline metal {ion} and an alkaline-earth metal ion is arranged apart from an active layer of a TFT as distantly as possible.

As for a configuration of the present invention disclosed in the present specification, in a semiconductor device having a TFT provided on an insulating surface of a substrate and a luminescent element for electrically connecting to the TFT, a luminescent device is characterized in that the said luminescent element is equipped with an organic compound layer, an anode and a cathode containing an alkaline metal, and the said luminescent device has an insulating layer for absorbing the said alkaline metal or an insulating layer for preventing the said alkaline metal from diffusing between the said TFT and the said luminescent element.

Moreover, as the other configuration of the present invention, in a semiconductor having a TFT provided on an insulating surface of a substrate and a luminescent element for electrically connecting to the TFT, a luminescent device is characterized in that the said luminescent element is equipped with an organic compound layer containing an alkaline metal, an anode, and a cathode, and the said luminescent device has an insulating layer for absorbing the said alkaline metal or an insulating layer for preventing the said alkaline metal from diffusing between the said TFT and the said luminescent element.

Moreover, as the other configuration of the present invention, in a semiconductor having a TFT provided on an insulating surface of a substrate and a luminescent element for electrically connecting to the TFT, a luminescent device is characterized in that the said luminescent element is equipped with an organic compound layer, an anode, a buffer layer containing an alkaline metal, and a cathode, and the said luminescent device has an insulating layer for absorbing the said alkaline metal or an insulating layer for preventing the said alkaline metal from diffusing between the said TFT and the said luminescent element.

Moreover, an insulating film for absorbing an alkaline-earth metal ion may be used, as the other configuration of the present invention, in a semiconductor having a TFT provided on an insulating surface of a substrate and a luminescent element for electrically connecting to the TFT, a luminescent device is characterized in that the said luminescent element is equipped with an organic compound layer, an anode, and a cathode containing an alkaline-earth metal, and the said luminescent device has an insulating layer for absorbing the said alkaline-earth metal or an insulating layer for preventing the said alkaline-earth metal from diffusing between the said TFT and the said luminescent element.

Moreover, as the other configuration of the present invention, in a semiconductor having a TFT provided on an insulating surface of a substrate and a luminescent element for electrically connecting to the TFT, a luminescent device is characterized in that the said luminescent element is equipped with an organic compound layer containing an alkaline-earth metal, an anode, and a cathode, and the said luminescent device has an insulating layer for absorbing the said alkaline-earth metal or an insulating layer for preventing the said alkaline-earth metal from diffusing between the said TFT and the said luminescent element.

Moreover, as the other configuration of the present invention, in a semiconductor having a TFT provided on an insulating surface of a substrate and a luminescent element for electrically connecting to the TFT, a luminescent device is characterized in that the said luminescent element is equipped with an organic compound layer, an anode, a buffer layer containing an alkaline-earth metal, and a cathode, and the said luminescent device has an insulating layer for absorbing the said alkaline-earth metal or an insulating layer for preventing the said alkaline-earth metal from diffusing between the said TFT and the said luminescent element.

Conventionally, an insulating film provided between a TFT and an EL element had a performance only for blocking an impurity ion of comparatively low level, however, by making it a configuration of the above-described present invention, the diffusion of an impurity ion (representatively, alkaline metal ion and alkaline-earth metal ion) from the EL element can be sufficiently prevented.

In the present invention, alkaline metals are referred to six elements of lithium (Li), sodium (Na), potassium (K), rubidium (Rb), cesium (Cs) and francium (Fr) in general, and alkaline-earth metals referred to magnesium (Mg), calcium (Ca), strontium (Sr) and Barium (Ba).

Moreover, in the present specification, an organic compound layer is referred to a layer containing at least organic compound, it may contain an inorganic material (silicon, silicon oxide or the like), and an organic compound layer contains a hole implantation layer, a hole transport layer, a luminescent layer, a blocking layer, an electron transport layer and an electron implantation layer or the like.

It should be noted that luminescence obtained from a luminescence of the present invention includes a luminescence by either of singlet excited state or triplet excited state, or both of these.

BRIEF DESCRIPTION OF THE DRAWINGS

FIGS. 1A to 1C are diagram showing embodiments of 1-3 of the present invention;

FIGS. 4A and 4B are sectional block diagram and top plan view of an EL module of Example 2 of the present invention;

DESCRIPTION OF THE PREFERRED EMBODIMENTS

Embodiment 1

Figure 2A:
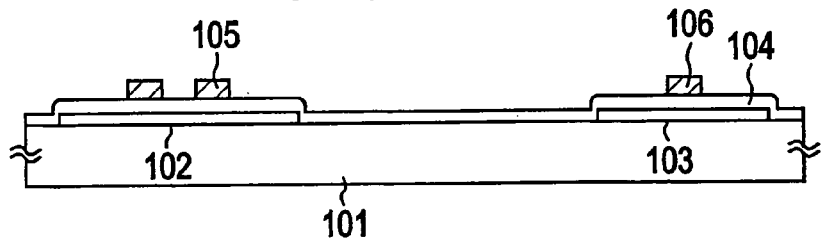
FIGS. 2A to 2E are diagram showing preparing processes of Example 1 of the present invention.
Figure 2B:
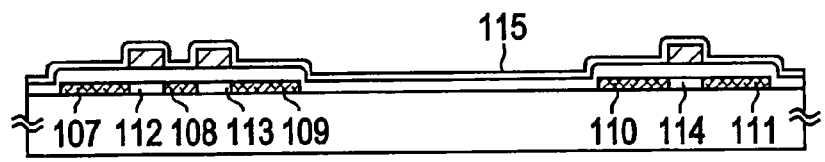
Figure 2C:
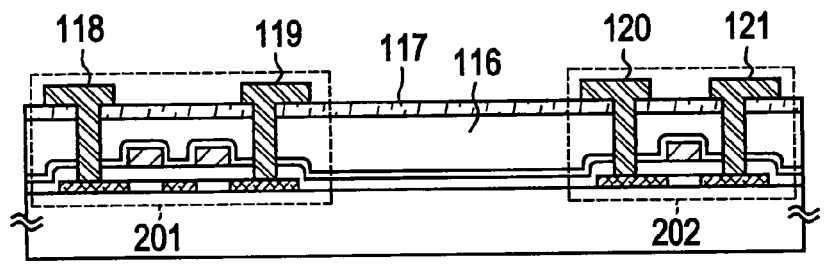
Figure 2D:
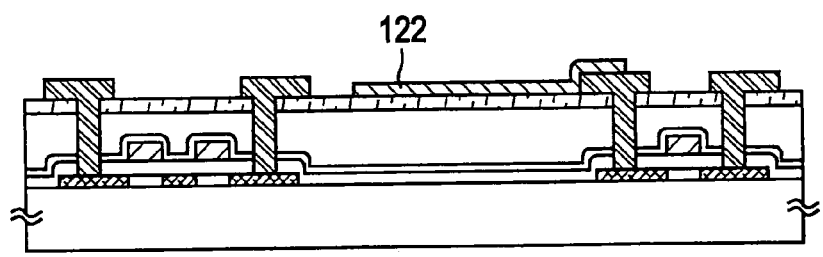
Figure 2E:
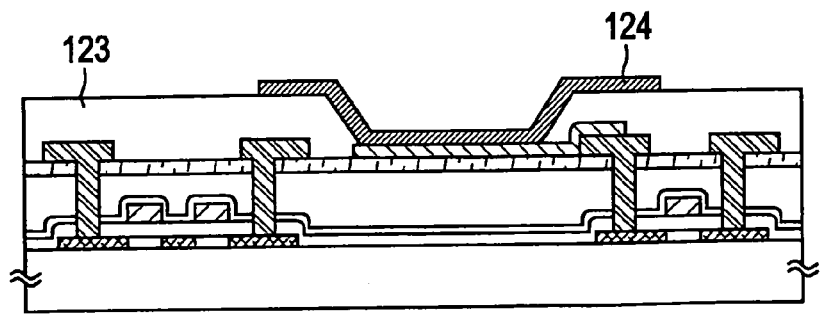

As embodiment 1 of the present invention, a sectional structure of a pixel section of a luminescent device will be described below with reference to FIG. 1A.

In FIG. 1A, a semiconductor element is formed on a substrate 101. It should be noted that as the substrate 101, a glass substrate is used as a substrate having an optical transparency, but quartz substrate may be used. Moreover, as a semiconductor element, a TFT is used, an active layer of each TFT has at least a channel formation region, a source region, and a drain region. Moreover, an active layer of each TFT is covered with a gate insulating film 104, and a gate electrode superimposing with the channel formation region via a gate insulating film is formed. Moreover, an interlayer insulating film for covering a gate electrode is provided, on the interlayer insulating film, an electrode for electrically connecting to a source region or a drain region of each TFT is provided. Moreover, an anode 122 for electrically connecting to an electrode reaching to the drain region of a TFT for current control 202 which is a p-channel type TFT, is provided. Moreover, an insulating layer 123 having an opening portion so as to cover the edge of the anode 122 and have an edge in a taper shape is provided. Moreover, an organic compound layer consisted of a hole generation layer 124 and an organic layer 125 is provided on the anode 122, a cathode 126 is provided on the organic compound layer, thereby forming a luminescent element. It should be noted that a luminescent element is sealed by a cover member 128 while remaining a space 129 as it was.

In this embodiment, it is configured that an active layer of a TFT is covered by a gate insulating film 104, and further, it is covered by an interlayer insulating film consisted of a protective film 115, an organic resin film 116, and a film 117 for absorbing an impurity ion. As a result of thus being configured, the diffusion of an impurity ion (representatively, alkaline metal ion and alkaline-earth metal ion) from a luminescent element can be sufficiently prevented.

Particularly, in the case where a material containing an alkaline metal and an alkaline-earth metal is used as a material for a cathode, an anode, a buffer layer, or an organic compound layer, the present invention is very effective.

In the present embodiment, as for the film 117 for absorbing an impurity ion, a silicon nitride film containing a large amount of fluorine, or an organic resin film containing a particle consisted of an antimony (Sb) compound for absorbing an alkaline metal ion, a tin (Sn) compound, or indium (In) compound or these laminated layer film may be used.

As the film 117 for absorbing an impurity ion, in the case where a silicon nitride film containing a large amount of fluorine is used, when the fluorine concentration contained in the film of the silicon nitride film is made $1 \times 10^{19}/cm^3$ or more, preferably, the composition ratio of the fluorine in the silicon nitride film is made in the range from 1 to 5%, the fluorine in the silicon nitride film is bonded to the impurity ion being diffused, captures it in the film. Once the impurity ion captured in the film, particularly, in the case of an alkaline metal ion (for example, Li), its bonding force to fluorine is very strong, therefore, it is scarcely released. Moreover, similarly, an alkaline-earth metal ion (for example, Mg) has a very strong bonding force to fluorine.

Moreover, as the film 117 for absorbing an impurity ion, in the case where a silicon nitride film containing fluorine at the composition ratio of 1 to 5%, a silicon oxynitride film (SiONF film) containing fluorine or a silicon oxide film (SiOF film) containing a large amount of fluorine is used, it can be made so that the degas from the organic resin film 116 does not exert a bad influence on the luminescent element.

Moreover, as the film 117 for absorbing an impurity ion, an organic resin film containing a particle consisted of an antimony (Sb) compound, a tin (Sn) compound, or an indium (In) compound is used, the particle contained in the film absorbs the impurity ion, particularly, an alkaline metal ion and an alkaline-earth metal ion. It should be noted that this organic resin film is made by mixing the above-described particle with one species or a plurality of species selected from an acetylacetonatochelate compound, an organic silicon compound, a metal alkoxide, and polysilazane and dispersed in an organic solvent. Moreover, since an EL element is very weak in the moisture, it is necessary to suppress the release of the moisture from the film 117 and the organic resin film 116 for absorbing an impurity ion.

Moreover, as for an EL element, if the thickness of the film of the organic compound layer is not uniform, since the variation is generated in its luminescence, it is preferable that an interlayer insulating film having a high flatness is used so that the film thickness of the organic compound layer having a film thickness becomes as uniform as possible. It should be noted that in the present embodiment, it is configured so that the flatness is enhanced using the organic resin film 116 of which the film thickness is thicker than that of the film 117 for absorbing an impurity ion. Moreover, if it has a sufficient flatness, an inorganic insulating film may be used instead of the organic resin film 116.

Moreover, the protective film 115 is a silicon nitride film, a silicon oxynitride film, and has an effect of preventing an impurity ion from diffusing from the organic resin film 116. In addition to this, the protective film 115 has also an effect of preventing an impurity ion from diffusing from the film 117 for absorbing an impurity ion and from the luminescent element. Moreover, the protective film 115 is provided for the purpose of preventing a gate electrode from denaturing such as oxidization or the like at the time of heat activation. Moreover, as the protective film 115, a silicon nitride film containing fluorine at the composition ratio of 1 to 5% is used, and absorbs an impurity ion, and further may prevent an impurity ion from diffusing.

It should be noted that a top gate type TFT has been exemplified and described herein, but not particularly limited to use of it. Instead of the top gate type TFT, it is capable of being applied to a bottom gate type TFT, a forward stagger type TFT and other TFT structures.

Moreover, herein, since the light emitted from a luminescent element has the emitting direction which transmits through the substrate 101, it is preferable that all of the protective film 115, organic resin film 116, the film 117 for absorbing an impurity ion have a sufficient optical transparency.

Embodiment 2

As embodiment 2 of the present invention, a sectional structure of a pixel section of a luminescent device will be described below with reference to FIG. 1B. It should be noted that since the components are same with those of embodiment 1 except for the configuration of an interlayer insulating film, the detailed description is omitted.

In the present embodiment, it is configured so that an active layer of a TFT is covered with the gate insulating film 104, and further, a film 317 for absorbing an impurity ion. As a result of being thus configured, the diffusion of an impurity ion (representatively, alkaline metal ion, and alkaline-earth metal ion) from the luminescent element can be sufficiently prevented.

As the film 317 for absorbing an impurity ion, a film which has a sufficient flatness and transparency, and of which the moisture release from the film is scarcely performed is used.

In the present embodiment, as the film 317 for absorbing an impurity ion, a silicon nitride film containing a large amount of fluorine, or an organic resin film containing a particle consisted of an antimony (Sb) compound, a tin (Sn) compound, or an indium (In) compound, or these laminated film may be used.

Embodiment 3

As embodiment 3 of the present invention, a sectional structure of a pixel section of a luminescent device will be described below with reference to FIG. 1C. It should be noted that since the components are same with those of embodiment 1 except for the configuration of an interlayer insulating film, the detailed description is omitted.

In the present mode for carrying out, it is configured so that an active layer of a TFT is covered with the gate insulating film 104, and further, a film 417 for absorbing an impurity ion and an interlayer insulating film consisted of an insulating film 418. As a result of being thus configured, the diffusion of an impurity ion (representatively, alkaline metal ion, and alkaline-earth metal ion) from the luminescent element can be sufficiently prevented.

In the present mode for carrying out, as the film 417 for absorbing an impurity ion, a silicon nitride film containing a large amount of fluorine, or an organic resin film containing a particle consisted of an antimony (Sb) compound, a tin (Sn) compound, or an indium (In) compound, or these laminated film may be used.

As the film 417 for absorbing an impurity ion, a film which has a sufficient flatness and optical transparency, and of which the moisture release from the film is scarcely performed is used.

Moreover, as for an insulating film 418, it is capable of being made so that the moisture and degas from the film 417 for absorbing an impurity does not exert a bad influence on a luminescent element.

The present invention comprising the above-described configuration will be further described in detail below with Examples indicated below.

EXAMPLES

Example 1

In the present example, a method for preparing a pixel section of a luminescent element will be described below with reference to FIG. 2 and FIG. 3. Moreover, in the present Example, as a semiconductor, a case where a thin film transistor (TFT) is formed will be described below.

First, a crystalline silicon film is formed on a transparent substrate 101 in a film thickness of 50 nm. It should be noted that as a method for forming a film of a crystalline silicon film, known means might be used. Subsequently, semiconductor layers 102 and 103 (hereinafter, referred to as active layer) consisted of a crystalline silicon film in an island shape are formed by patterning a crystalline silicon film. Subsequently, the gate insulating film 104 consisted of a silicon oxide film is formed by covering the active layer 102 and 103. Subsequently, the gate electrode 105 and 106 are formed on the gate insulating film 104. (FIG. 1A) As a material for forming the gate electrodes 105, 106, an element selected from Ta, W, Ti, Mo, Al, and Cu, or an alloy material of which main components are the said elements or a compound material may be used. Here, for gate electrodes 105 and 106, a tungsten film having a film thickness of 350 nm or a tungsten alloy film is used. Moreover, the gate electrode may be a laminated structure having two layers or more, or it may be three layer structure by in turn laminating a tungsten film having a film thickness of 50 nm, an alloy film of aluminum and silicon (Al—Si) having a film thickness of 500 nm.

Subsequently, as shown in FIG. 2 B, by utilizing the gate electrodes 105 and 106 as a mask, an element belonging to XIII group of the periodic table (representatively, boron) is added. As a method for adding, known means may be used. In this way, an impurity region indicating p-type conductive type (hereinafter, referred to p-type impurity region) 107 to 111 is formed. Moreover, immediately below the gate electrodes 105 and 106, channel formation regions 112 to 114 are fractioned and fixed. It should be noted that the p-type impurity regions 107 to 111 are a source region or a drain region of the TFT.

Subsequently, the protective film (herein, silicon nitride film) 115 is formed in a film thickness of 50 nm, then, the activation of the element belonging to XIII group of the periodic table, which has added, is performed by performing the heat processing. This activation may be performed by either of furnace annealing, laser annealing or a lump annealing, or performed by combining these. In the present example, the heat processing at 500° C. for 4 hours is performed under the atmosphere of nitrogen.

When the activation is terminated, it is effective to perform hydrogenation. As for hydrogenation processing, known hydrogen annealing technology or plasma hydrogenation technology may be used.

Subsequently, as shown in FIG. 2 C, the first interlayer insulating film 116 consisted of an organic resin film such as polyimide, acryl, polyimideamide or the like is formed into a thickness of 800 nm. These materials are coated with spinner, it is heated, burned or polymerized and formed, thereby capable of being smoothing the surface. Moreover, since an organic resin material is in general low in dielectric constant, parasitic volume can be reduced. It should be noted that as the first interlayer insulating film 116, an inorganic insulating film might be used.

Subsequently, the second interlayer insulating film 117 is formed on the first interlayer insulating film 116. The second interlayer insulating film 117 may be formed by an insulating film for absorbing an impurity ion, preferably absorbing a metal element, and further preferably absorbing an alkaline metal or an alkaline-earth metal, representatively, a silicon nitride film containing fluorine at the composition ratio of 1 to 5%, an organic resin film containing a particle consisted of an antimony compound ($Sb_2O_5$, $nH_2O$), or a laminated layer made by combining these. In the present Example, an organic resin film containing antimony pentaoxide ($Sb_2O_5.nH_2O$) of which the average particle diameter is 10 to 20 nm is used. After antimony pentaoxide particle and polymethyl silceschioxane copolymer were dispersed in an organic solvent of glycols, ethers, alcohols, ketones, and the coating was performed by spin coat or the like, the film is formed by hardening. As for hardening means, hardening may be performed by heating or irradiation of ultraviolet ray.

Moreover, in the case where as an insulating film for absorbing an alkaline metal or an alkaline-earth metal, a silicon nitride film containing fluorine at the composition ratio of 1 to 5% is used, the degas from the first interlayer insulating film 116 is made not to exert a bad influence on the luminescent element.

It is capable of being configured so that the diffusion of an impurity ion from a cathode containing an alkaline metal and an alkaline-earth metal formed later does not exert a bad influence on the active layer of TFT by employing an insulating film for absorbing an alkaline metal or an alkaline-earth metal for the second interlayer insulating film 117. Moreover, the diffusion of an impurity ion to the active layer of TFT is contemplated by providing the first interlayer insulating film 116 and enhancing the flatness, and by widening the interval of distance between the insulating film for absorbing an alkaline metal or an alkaline-earth metal and the active layer of TFT.

Subsequently, a resist mask of the desired pattern is formed, a contact hole reaching to the drain region of TFT is formed by performing an etching of the interlayer insulating film, and the wirings 118 to 121 are formed. As a wiring material, Al and Ti as an electrically conductive metal film are used, besides these, these alloy material are used, after it is formed into a film by a sputter method and vacuum vapor deposition method, it may be patterned into the desired shape.

In this stage, TFT is completed. On the pixel section of the luminescent device, the TFT for switching 201 and the TFT for current control 202 are formed, at the same time, the TFT for deleting (not shown) is also formed. It should be noted that the gate electrode of TFT for deleting is formed by one portion of gate wirings different from the gate wirings for forming the gate electrode of the TFT 201 for switching. It should be noted that in the present example, all of these TFT are formed by p-channel type TFT. Moreover, although here not shown, the retention volume is also formed. The retention volume is formed by lower retention volume formed by the semiconductor layer formed at the same time with activation layer of TFT and by the wirings for forming gate insulating films and gate electrodes, and upper retention volume formed by the wirings for forming gate electrodes, the protective film, the first interlayer insulating film, the second interlayer insulating film and the current supplying wirings. Moreover, the semiconductor layer is electrically connected to the current supplying wires.

Subsequently, an electrically conductive film having an optical transparency which is to be the anode 122 of the luminescent element, that is, herein an ITO film is formed. Moreover, as for the anode 122, a material having a work function larger than that of the material for forming the cathode, and further, a material having a sheet resistance than that of ITO film, concretely, a material such as platinum (Pt), Chromium (Cr), tungsten (W), or Nickel (Ni) can be used. It should be noted that the film thickness of this time is preferably made in the range from 0.1 to 1 µm. Moreover, these metal elements used for the anode is also absorbed by the second interlayer insulating film 117, and the diffusion into TFT may be prevented.

Subsequently, as shown in FIG. 2 D, the anode 122 is formed by etching an electrically conductive film.

Then, an organic resin film consisted of polyimide, acryl, and polyimideamide is formed over the whole surface. As for these, a heat hardening material which is hardened by heating, or a photosensitive material which is hardened by irradiating ultraviolet ray can be employed. In the case where the heat hardening material is used, then, resist mask is formed, an insulating layer 123 having an opening portion is formed on the anode 122 by dry etching. In the case where a photosensitive material is used, the insulating layer 123 having an opening portion is formed on the anode 122 by performing the exposure using photomask, and by performing a developing processing. Any way, the insulating layer 123 is formed so that the end portion of the anode 122 is covered and it has the edge in a taper shape. The coating property of the organic compound layer formed later is capable of being improved by forming an edge in a taper shape.

Subsequently, the hole generation layer 124 is formed on the anode 122. It should be noted that in the present example, the hole generation layer 124 is a film having transparency, formed by co-vapor depositing a low molecular material and electron receptor as an organic material. It should be noted that as a low molecular material, such as condensed ring hydrocarbon including anthracene, tetracene, pyrene and the like, linear paraffin, oligothiophene based material and phthalocyanine based material can be used, as electron receptor, TCNQ (tetracyano-quinodimethan), $FeCl_3$, $ZrCl_4$, $HfCl_4$, $NbCl_5$, $TaCl_5$, $MoCl_5$, and $WCl_6$ can be utilized.

Moreover, when the hole generation layer 124 is formed, the ratio of the low molecular material to the electron receptor is preferably 1:1 at the molar ratio.

It should be noted that the patterning could be performed to the hole generation layer 124 into a shape as shown in FIG. 2 E by forming the hole generation layer using a metal mask by a vapor deposition method. The hole generation layer 124 is formed as described above.

After the hole generation layer 124 has been formed, an organic layer 125 laminated by combining a plurality of layers such as the hole implantation layer, the hole transport layer, the hole inhibition layer, the electron transport layer, the electron implantation layer and the buffer layer besides the luminescent layer is formed. Moreover, the organic layer 125 is formed in a thickness of about 50 nm (FIG. 3 A). It should be noted that in the present example, including the hole generation layer 124 and the organic layer 125, it is referred to an organic compound layer 130. It should be noted that as an organic compound for forming the organic compound layer, the low molecule based material or the high molecule based material may be used, a single layer using a known material or a laminated layer can be formed by combining these in multiple combination.

Figure 3A:
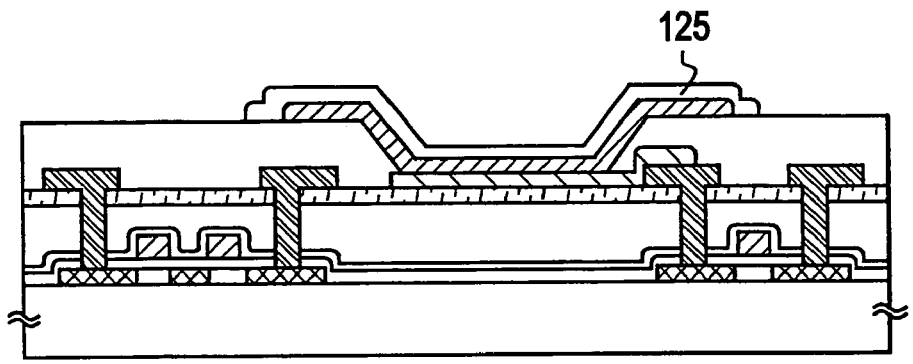
FIGS. 3A to 3C are diagram showing preparing processes of Example 1 of the present invention.
Figure 3B:
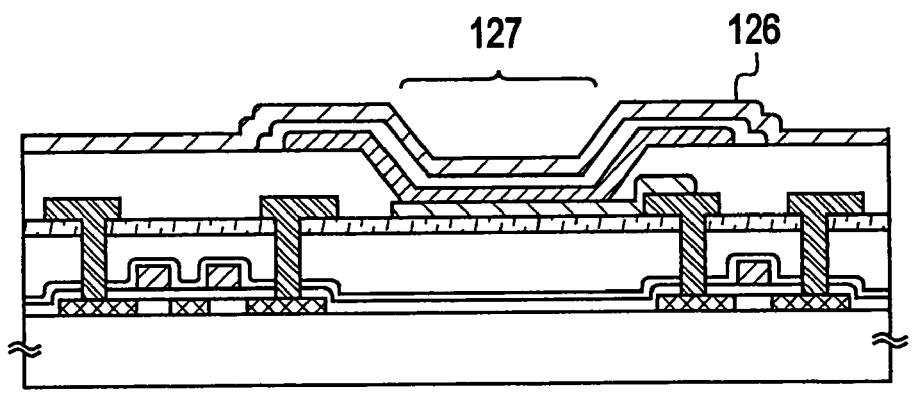
Figure 3C:
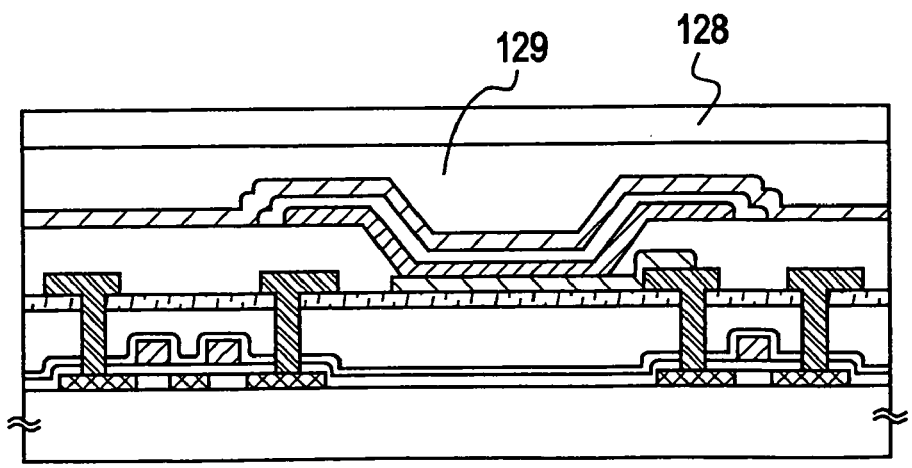

Next, the cathode 126 is formed by a vapor deposition method (FIG. 3 B). As a material to be the anode 126, besides Al—Li alloy and Mg—Ag alloy, a film formed using elements belonging to I group or II group of the periodic table and aluminum by co-vapor deposition method can be used. It should be noted that the film thickness of the cathode 126 is preferably in the range from 80 to 200 nm. Here, an electrode containing a large amount of an alkaline metal or an alkaline-earth metal is formed, however, an alkaline metal or an alkaline-earth metal which promotes the deterioration of the TFT is absorbed by the second interlayer insulating film 117, and the invasion of these into the TFT can be prevented.

By the processes described above, the luminescent element 127 consisted of the anode 122, the organic compound layer 130 and the cathode 126 can be completed.

Furthermore, as shown in FIG. 3 C, the luminescent element 127 is sealed with the cover member 128 or the like, entered into the space 129 and sealed. As a result of this, the luminescent element 127 can be completely shut out, and the invasion of the substances which promotes the deterioration of the organic compound layer such as moisture and oxygen from the exterior can be prevented.

It should be noted that as a material configuring the cover member 128, besides glass substrate, quartz substrate, a plastic substrate consisted of FRP (Fiberglass-Reinforced Plastics), PVF (polyvinylfluoride), Mylar, polyester or acryl and the like can be used.

Moreover, the present example corresponds to embodiment 1, and the same reference numerals are used and attached at the same locations.

Example 2

Referring to FIG. 4, the external appearance of a light emitting device of the present invention will be described in the present invention.

Figure 4A:
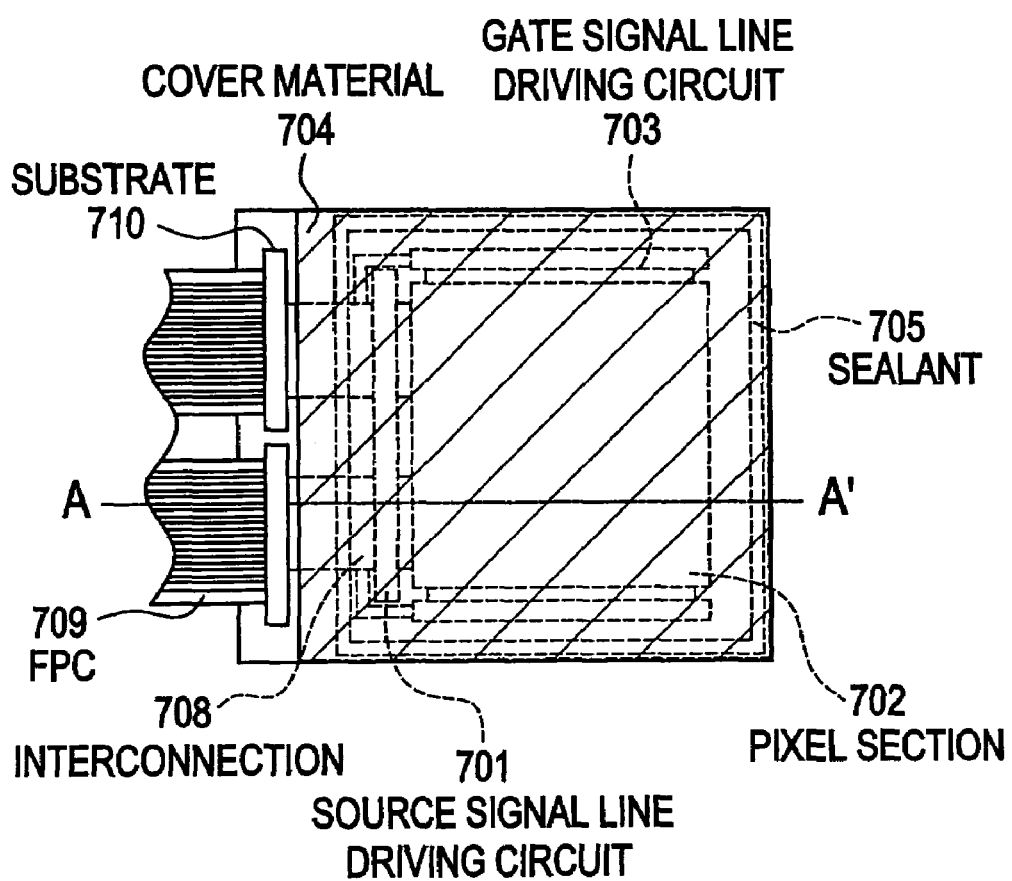

FIG. 4A is a top view of the light emitting device, and FIG. 4B is a sectional view taken on line A-A' of FIG. 4A. Reference number 701 represents a source signal line driving circuit, which is shown by a dotted line; 702, a pixel section; 703, a gate signal line driving circuit; 710, a substrate; 704, a cover material; and 705, a sealant. A space 707 is surrounded by the substrate 710, the cover material 704, and the sealant 705.

Reference number 708 represents an interconnect ion for transmitting signals inputted to the source signal line driving circuit 701 and the gate signal line driving circuit 703. The interconnection 708 receives video signals or clock signals from a flexible print circuit (FPC) 709, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 4B. The driving circuits and the pixel section are formed on the substrate 710, but the source signal line driving circuit 701 as one of the driving circuits and the pixel section 702 are shown in FIG. 4B.

In the source signal line driving circuit 701, a CMOS circuit wherein an n-channel type TFT 713 and a p-channel type TFT 714 are combined is formed. The TFTs constituting the driving circuit may be composed of known CMOS circuits, PMOS circuits or NMOS circuits. In the present example, a driver-integrated type, wherein the driving circuit is formed on the substrate, is illustrated, but the driver-integrated type may not necessarily be adopted. The driver may be fitted not to the substrate but to the outside.

The pixel section 702 is composed of plural pixels including a current-controlling TFT 711 and an anode 712 electrically connected to the drain of the TFT 711.

In the anode 712, slits are made. On the both sides of the anode 712, insulators 715 are formed, and an organic compound layer 717 composed of a hole injection layer 716, a hole generating layer, a hole transport layer, a light emitting layer and an electron transport layer is formed. Furthermore, a cathode 718 is formed on the insulators 715 and the organic compound layer 717. In this way, a light emitting element 719 composed of the anode, the organic compound layer and the cathode is formed.

The cathode 718 also functions as an interconnection common to all of the pixels, and is electrically connected through the interconnection 708 to the FPC 709.

In order to confine the light emitting element 719 formed on the substrate 710 airtightly, the cover material 704 is adhered to the substrate 710 with the sealant 705. A spacer made of a resin film may be set up to keep a given interval between the cover material 704 and the light emitting element 719. An inert gas such as nitrogen is filled into the space 707 inside the sealant 705. As the sealant 705, an epoxy resin is preferably used. The sealant 705 is desirably made of a material through which water content or oxygen is transmitted as slightly as possible. Furthermore, it is allowable to incorporate a material having moisture absorption effect or a material having antioxidation effect into the space 707.

In the present example, as the material making the cover material 704, there may be used a glass substrate, a quartz substrate, or a plastic substrate made of fiber glass-reinforced plastic (FRP), polyvinyl fluoride (PVF), mylar, polyester or polyacrylic resin.

After the adhesion of the cover material 704 to the substrate 710 with the sealant 705, a sealant is applied so as to cover the side faces (exposure faces).

As described above, the light emitting element is airtightly put into the space 707, so that the light emitting element can be completely shut out from the outside and materials promoting deterioration of the organic compound layer, such as water content and oxygen, can be prevented from invading this layer from the outside. Consequently, the light emitting device can be made highly reliable.

When any one of the structures of Embodiment modes 1 to 3, and Example 1 is airtightly confined inside a space to manufacture a light emitting device, the structure of the present invention may be freely combined with the structure.

Example 3

Figure 5A:
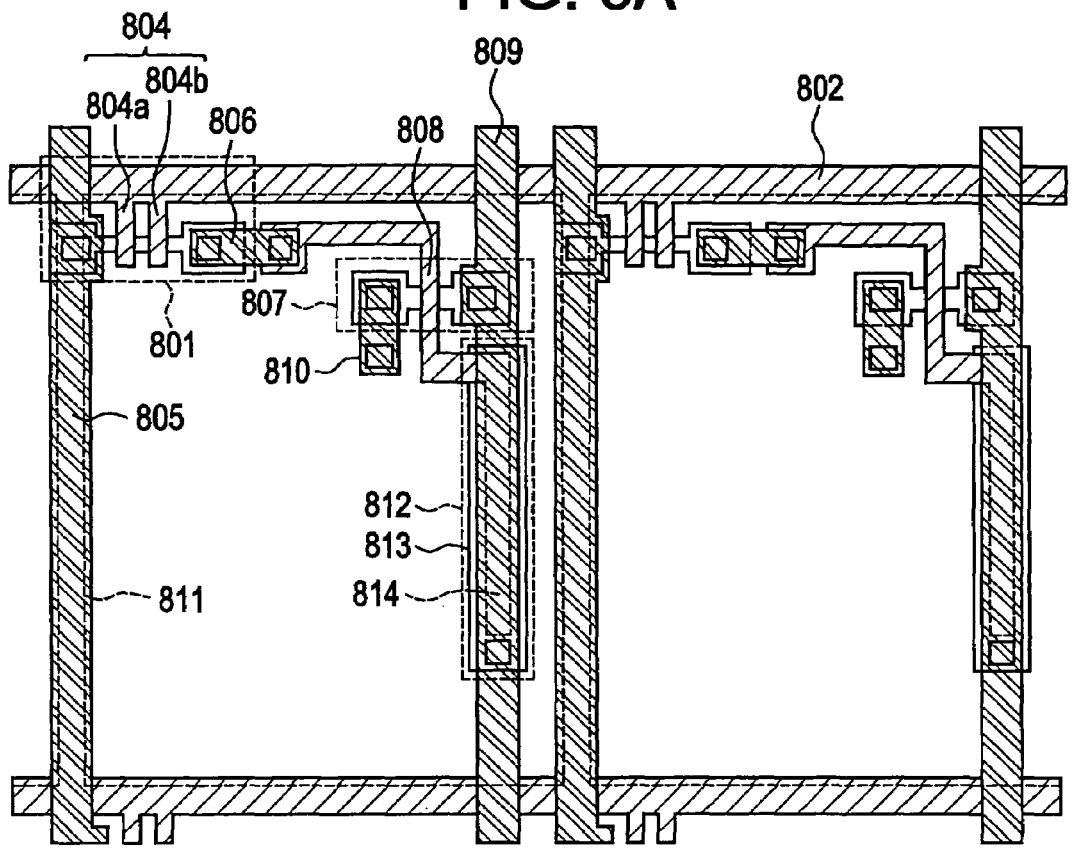
FIGS. 5A and 5B are diagram showing a configuration of a pixel section of Example 3 of the present invention.
Figure 5B:
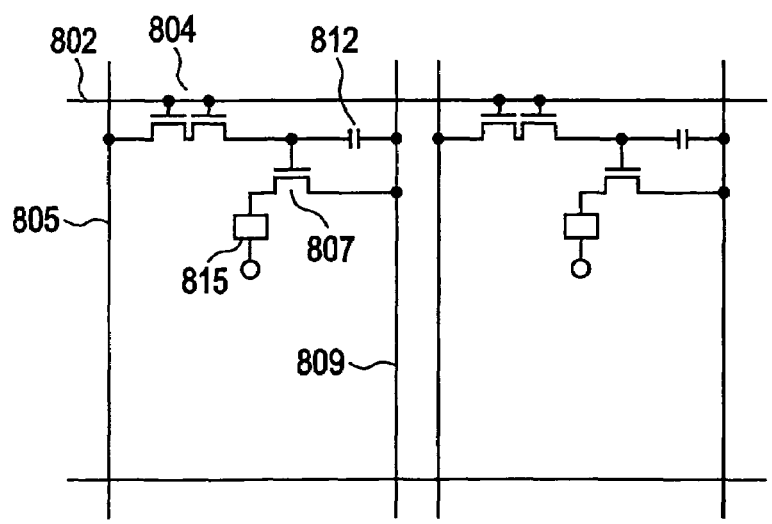

A light emitting device of the present invention can be made up to a pixel section illustrated in FIG. 5A. The circuit configuration of the device illustrated in FIG. 5A is illustrated in FIG. 5B.

In FIG. 5A, reference number 801 represents a switching TFT, which is an n-channel type TFT. An interconnection 802 is a gate interconnection for connecting gate electrodes 804 (804a and 804b) of the switching TFT 801 electrically.

In the present example, a double-gate structure, wherein two channel-formed areas are laid out, is adopted. However, a single-gate structure, wherein a single channel-formed area is formed, or a triple-gate structure, wherein three channel-formed areas are formed, may be adopted.

The source of the switching TFT 801 is connected to a source interconnection 805, and the drain thereof is connected to a drain interconnection 806. The drain interconnection 806 is electrically connected to a gate electrode 808 of the current-controlling TFT 807. The current-controlling TFT 807 is made up of a p-channel type TFT. In the present example, a single-gate structure is adopted. However, a double-gate structure or a triple-gate structure may be adopted.

In the present example, the switching TFT 801 is made up of an n-channel type TFT, and the current-controlling TFT 807 is made up of a p-channel type TFT. However, the switching TFT 801 may be made up of a p-channel type TFT, and the current-controlling TFT 807 may be made up of an n-channel type TFT. Both of them may be made up of n-channel type TFTs or p-channel type TFTs.

The source of the current-controlling TFT 807 is electrically connected to a current-supplying line 809, and the drain thereof is electrically connected to a drain interconnection 810. The drain interconnection 810 is electrically connected to an electrode (anode) 811 shown by a dotted line. By forming an organic compound layer and an electrode (cathode) on the electrode (anode) 811, a light emitting element 815 illustrated in FIG. 5B can be formed.

In a region 812, a retention capacitor (condenser) is formed. The condenser 812 is composed of a semiconductor film 813 electrically connected to the current-supplying line 809, an insulating film (not illustrated) as the same layer which constitutes the gate insulating film, and a capacitor electrode 814 electrically connected to the gate electrode 808. A capacitor composed of the capacitor electrode 814, the same layer (not illustrated) that constitutes an interlayer dielectric, and the current-supplying line 809 may be used as a retention capacitor.

The structure of the pixel section described in the present example may be combined instead of the pixel section described in Example 1.

Further, in the present example, the pixel section and TFT (n-channel type TFT and p-channel type TFT) of the driver circuit provided in the periphery of the pixel section are formed simultaneously on the same substrate. In addition, the light emitting element connected electrically to the TFT is formed in the pixel section so as to form an element substrate.

Example 4

An example of light from a light emitting element being emitted in a downward direction through a substrate is shown in Example 1. In the present example, however, an example of light emitted from a light emitting element in an upward-direction is shown in FIGS. 6A and 6B.

Note that although a glass substrate is used as a substrate 600 in the present example, quartz substrates, silicon substrates, metallic substrates, and ceramic substrates may also be used.

Active layers of each TFT are prepared with at least a channel forming region, a source region, and a drain region in FIG. 6A. Further, the active layers of each TFT are covered by a gate insulating film, and a gate electrode is formed so as to overlap with the channel forming region through the gate insulating film. An interlayer insulating film is formed covering the gate electrode, and electrodes that are electrically connected to the source region or the drain region of each of the TFTs are formed on the interlayer insulating film. A cathode 622 that is electrically connected to a current control TFT 602, an n-channel TFT, is then formed. Further, an insulating layer 623 having an opening portion is formed covering an edge portion of the cathode 622 and having a tapered shape border. An organic compound layer composed of an organic layer 624 and a hole injecting layer 625 is formed on the cathode 622, and an anode 626 is formed on the organic compound layer, thus forming a light emitting element. Note that the light emitting element is sealed by a covering material while maintaining a space.

In the present example, an active layer of TFT is overlapped with the gate insulating film, the protective film, the organic resin film, and the interlayer insulating film formed out of film 617 absorbing impurity ion, sequentially. According to this structure, a diffusion of impurity ion (typically, alkaline metal ion) from the light emitting element can be prevented enough.

It is preferable to form the cathode using Al or an Al—Li aluminum alloy, which have small work functions. A transparent conductive film is used in the anode, and it is possible to use materials such as a compound of indium oxide and tin oxide (referred to as ITO), a compound of indium oxide and zinc oxide, tin oxide, and zinc oxide for the transparent conductive film.

In the present example, nonconductive compounds include the alkali metal or the alkali earth metal (referred to as the alkali compound hereinafter) can be formed on all cathodes before the organic compound layer is formed. As for the alkali compound, lithium fluoride (LiF), lithium oxide ($Li_2O$), barium fluoride ($BaF_2$), barium oxide (BaO), calcium fluoride ($CaF_2$), calcium oxide (CaO), strontium oxide (SrO) or cesium oxide ($Cs_2O$) can be used.

Especially, the structure of the present example is effective in the case that the materials such as the alkali metal or alkali earth metal to the cathode, the anode, the buffer layer, or the organic compound layer.

In the present example, film 617, which absorbs an impurity ion, may use the organic resin film which contains the corpuscle made of nitride silicon film including a great quantity of fluoride, antimony (Sb) compound, tin (Sn) compound, or indium (In) compound or lamination film of these.

Figure 6:
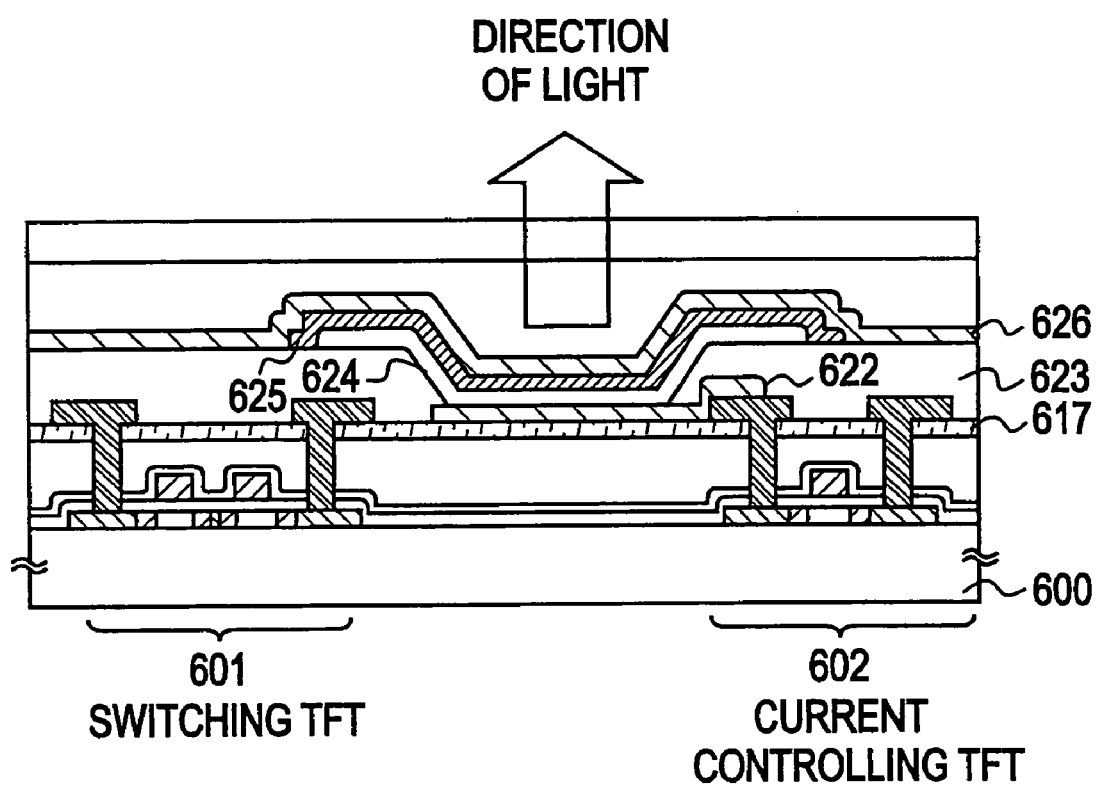
FIG. 6 is a diagram showing Example 4 of the present invention.

The light emitting device may have a light emitting element, in which light generated from the organic compound layer radiate to the outside to the direction of the arrow shown in FIG. 6 by the present example.

Further, in the present example, the pixel section and TFT (n-channel type TFT and p-channel type TFT) of the driver circuit provided in the periphery of the pixel section are formed simultaneously on the same substrate. In addition, the light emitting element connected electrically to the TFT is formed in the pixel section so as to form an element substrate.

Example 5

A light emitting device using a light emitting element is self-luminous and therefore is superior in visibility in bright surroundings compared to liquid crystal display devices and has wider viewing angle. Accordingly, it can be used for display portions of various electric equipments.

Given as examples of electric equipment employing a light emitting device formed by the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device (specifically, a device equipped with a display device which can reproduce a recording medium such as a digital versatile disk (DVD), and can display the image). The light emitting device having a light emitting element is desirable particularly for a portable information terminal since its screen is often viewed obliquely and is required to have a wide viewing angle. Specific examples of the electric equipment are shown in FIGS. 7A to 7H.

Figure 7A:
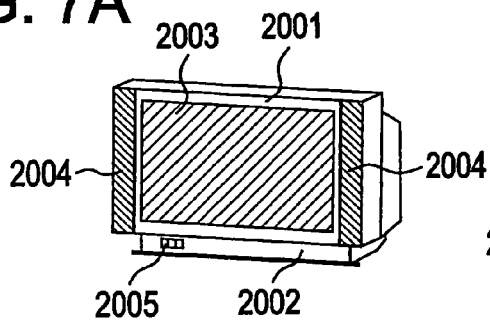
FIGS. 7A to 7H are diagram showing one example of an electronic device.

FIG. 7A shows a display device, which comprises a casing 2001, a supporting base 2002, a display portion 2003, speaker portions 2004, a video input terminal 2005, etc. The light emitting device formed by the present invention is applied can be used for the display portion 2003. The light emitting device having a light emitting element is self-luminous and does not need a backlight, so that it can make a thinner display portion than liquid display devices can. The term display device includes every display device for displaying information such as one for a personal computer, one for receiving TV broadcasting, and one for advertisement. In addition, the display shown in FIG. 7A is small-medium type or large type, for example, screen of the display sized 5 to 20 inches. Moreover, it is preferable to mass-produce by executing a multiple pattern using a substrate sized 1×1 m to form such sized display section.

Figure 7B:
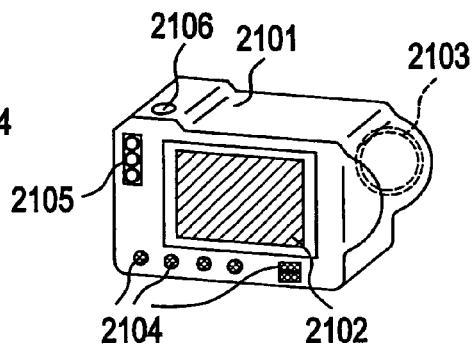

FIG. 7B shows a digital still camera, which comprises a main body 2101, a display portion 2102, an image receiving portion 2103, operation keys 2104, an external connection port 2105, a shutter 2106, etc. The light emitting device formed by the present invention is applied can be used for the display portion 2102.

Figure 7C:
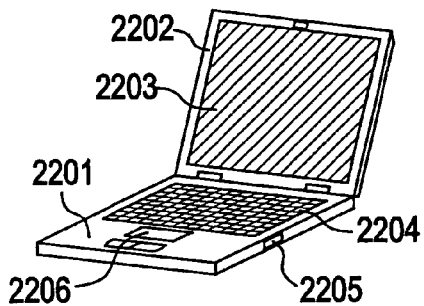

FIG. 7C shows a laptop computer, which comprises a main body 2201, a casing 2202, a display portion 2203, a keyboard 2204, an external connection port 2205, a pointing mouse 2206, etc. The light emitting device formed by the present invention is applied can be used for the display portion 2203.

Figure 7D:
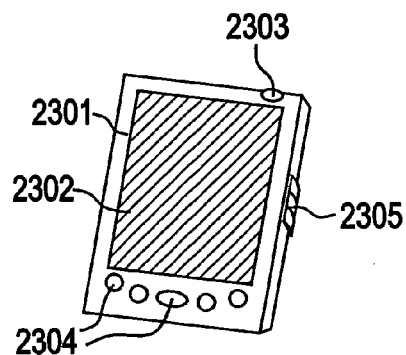

FIG. 7D shows a mobile computer, which comprises a main body 2301, a display portion 2302, a switch 2303, operation keys 2304, an infrared ray port 2305, etc. The light emitting device formed by the present invention is applied can be used for the display portion 2302.

Figure 7E:
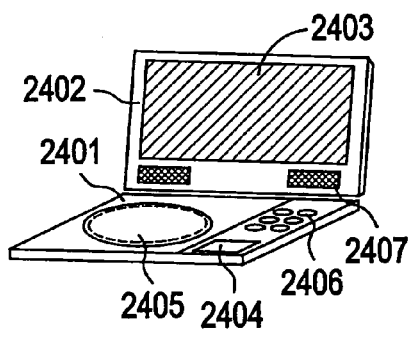

FIG. 7E shows a portable image reproducing device equipped with a recording medium (a DVD player, to be specific). The device comprises a main body 2401, a casing 2402, a display portion A 2403, a display portion B 2404, a recording medium (DVD) reading portion 2405, operation keys 2406, speaker portions 2407, etc. The display portion A 2403 mainly displays image information whereas the display portion B 2404 mainly displays text information. The light emitting device formed by the present invention is applied can be used for the display portions A 2403 and B 2404. The term image reproducing device equipped with a recording medium includes video game machines.

Figure 7F:
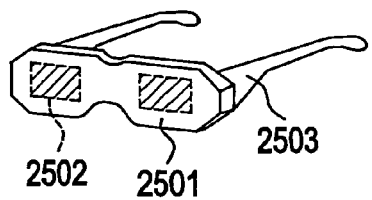

FIG. 7F shows a goggle type display (head mounted display), which comprises a main body 2501, display portions 2502, and arm portions 2503. The light emitting device formed by the present invention is applied can be used for the display portions 2502.

Figure 7G:
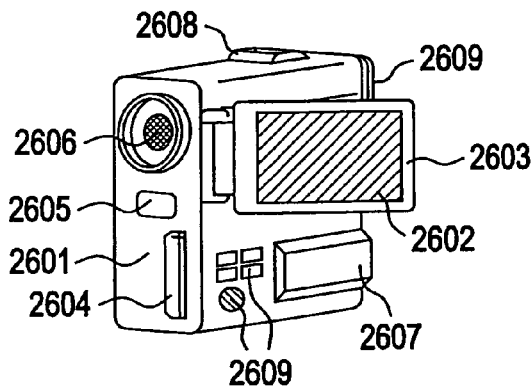

FIG. 7G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, etc. The light emitting device formed by the present invention is applied can be used for the display portion 2602.

Figure 7H:
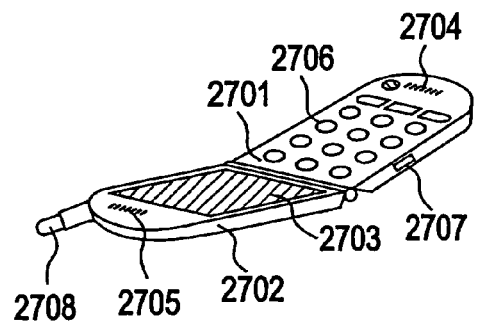

FIG. 7H shows a cellular phone, which comprises a main body 2701, a casing 2702, a display portion 2703, an audio input portion 2704, an audio output portion 2705, operation keys 2706, an external connection port 2707, an antenna 2708, etc. The light emitting device formed by the present invention is applied can be used for the display portion 2703. If the display portion 2703 displays white characters on a black background, power consumption of the cellular phone can be reduced.

If the luminance of light emitted from organic materials is increased in future, the light emitting device having a light emitting element can be used also in a front or rear projector in which light bearing outputted image information is magnified by a lens or the like to be projected on a screen.

The electric equipment given in the above often displays information distributed through electronic communication lines such as Internet and CATV (cable television), especially, animation information with increasing frequency. The light emitting device having a light emitting element is suitable for displaying animation information since organic materials have fast response speed.

In the light emitting device, portions that emit light consume power. Therefore, it is desirable to display information such that as small portions as possible emits light. Accordingly, if the light emitting device is used for a display portion that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electric equipment of every field can employ the device. The electric equipments in this example may use the light emitting device formed in Examples 1 to 4 to the display portion thereof.

Conventionally, an insulating film provided between a TFT and an EL element had a performance only for blocking an impurity ion of comparatively low level, but by making it a configuration of the above-described present invention, the diffusion of an impurity ion (representatively, alkaline metal ion and alkaline-earth metal ion) from the EL element can be sufficiently prevented.

Accordingly, a luminescent element having a higher reliability comparing to the conventional element can be formed. Moreover, an electric appliance having a high performance can be obtained using a luminescent device having such a luminescent element as a display section.

What is claimed is:
1. A luminescent device comprising:
   a thin film transistor provided over an insulating surface;
   a luminescent element electrically connected with said thin film transistor, comprising:
      an organic compound layer;
      an anode; and
      a cathode containing an alkaline-earth metal; and
   at least one insulating layer provided between said thin film transistor and said luminescent element,
   wherein said at least one insulating layer is capable of absorbing said alkaline-earth metal.
2. A device according to claim 1, wherein said at least one insulating layer comprises a silicon nitride film containing fluorine at a concentration of $1 \times 10^{19}/cm^3$ or more.

3. A device according to claim 1, wherein said at least one insulating layer comprises an organic resin film containing a particle comprising an antimony (Sb) compound, a tin (Sn) compound, or indium (In) compound.

4. A device according to claim 1, wherein said at least one insulating layer comprises a laminated layer of a silicon nitride film containing fluorine at a concentration of $1 \times 10^{19}/cm^3$ or more and an organic resin film containing a particle comprising an antimony (Sb) compound, a tin (Sn) compound, or indium (In) compound.

5. A device according to claim 1, wherein said at least one insulating layer comprises a silicon oxynitride film or a silicon oxide film containing fluorine at a concentration of $1 \times 10^{19}/cm^3$ or more.

6. A luminescent device comprising:
   a thin film transistor provided over an insulating surface;
   a luminescent element electrically connected with said thin film transistor, comprising:
      an organic compound layer;
      an anode; and
      a cathode containing an alkaline-earth metal; and
   at least one insulating layer provided between said thin film transistor and said luminescent element,
   wherein said at least one insulating layer has optical transparency, and
   wherein said at least one insulating layer is capable of absorbing said alkaline-earth metal.

7. A device according to claim 6, wherein said at least one insulating layer comprises a silicon nitride film containing fluorine at a concentration of $1 \times 10^{19}/cm^3$ or more.

8. A device according to claim 6, wherein said at least one insulating layer comprises an organic resin film containing a particle comprising an antimony (Sb) compound, a tin (Sn) compound, or indium (In) compound.

9. A device according to claim 6, wherein said at least one insulating layer comprises a laminated layer of a silicon nitride film containing fluorine at a concentration of $1 \times 10^{19}/cm^3$ or more and an organic resin film containing a particle comprising an antimony (Sb) compound, a tin (Sn) compound, or indium (In) compound.

10. A luminescent device comprising:
    a thin film transistor provided over an insulating surface;
    a luminescent element electrically connected with said thin film transistor, comprising:
       an organic compound layer;
       an anode; and
       a cathode containing an alkaline-earth metal; and
    a first insulating layer provided between said thin film transistor and said luminescent element; and
    a second insulating layer provided between said thin film transistor and said luminescent element,
    wherein said first insulating layer is capable of absorbing said alkaline-earth metal.

11. A device according to claim 10, wherein said first insulating layer comprises a silicon nitride film containing fluorine at a concentration of $1 \times 10^{19}/cm^3$ or more.

12. A device according to claim 10, wherein said first insulating layer comprises an organic resin film containing a particle comprising an antimony (Sb) compound, a tin (Sn) compound, or indium (In) compound.

13. A device according to claim 10, wherein said first insulating layer comprises a laminated layer of a silicon nitride film containing fluorine at a concentration of $1 \times 10^{19}/cm^3$ or more and an organic resin film containing a particle comprising an antimony (Sb) compound, a tin (Sn) compound, or indium (In) compound.

14. A device according to claim 10, wherein said first insulating layer comprises a silicon oxynitride film or a silicon oxide film containing fluorine at a concentration of $1 \times 10^{19}/cm^3$ or more.

15. A device according to claim 10, wherein said second insulating layer is an organic resin film provided between said thin film transistor and said first insulating layer.

16. A device according to claim 10, wherein said second insulating layer is provided between said first insulating layer and said luminescent element.

* * * * *